US006504178B2

United States Patent
Carlson et al.

(10) Patent No.: US 6,504,178 B2
(45) Date of Patent: Jan. 7, 2003

(54) INDIRECT BACK SURFACE CONTACT TO SEMICONDUCTOR DEVICES

(75) Inventors: Lars S. Carlson, Del Mar, CA (US); Shulai Zhao, Encinitas, CA (US); Richard Wilson, Oceanside, CA (US)

(73) Assignee: Digirad Corporation, San Diego, CA (US)

(*) Notice: Subject to any disclaimer, the term of this patent is extended or adjusted under 35 U.S.C. 154(b) by 0 days.

(21) Appl. No.: 09/828,694

(22) Filed: Apr. 5, 2001

(65) Prior Publication Data

US 2002/0011639 A1 Jan. 31, 2002

Related U.S. Application Data

(63) Continuation of application No. 09/607,547, filed on Jun. 29, 2000.
(60) Provisional application No. 60/142,139, filed on Jul. 2, 1999.

(51) Int. Cl.⁷ .............................................. H01L 27/15
(52) U.S. Cl. .............................. 257/86; 257/46; 257/87; 257/106; 257/601; 257/656; 257/749
(58) Field of Search ..................... 257/86, 87, 88, 257/106, 46, 601, 656, 605, 749

(56) References Cited

U.S. PATENT DOCUMENTS 4,458,260 A  * 7/1984 McIntyre et al. ............. 357/30
4,854,974 A    8/1989 Carlson et al.
5,598,016 A    1/1997 Tanabe et al.
5,719,414 A  * 2/1998 Sato et al. ................. 257/186
6,025,585 A    2/2000 Holland
6,177,293 B1 * 1/2001 Netzer et al. ................ 438/73

FOREIGN PATENT DOCUMENTS

JP    57028367 A  *  2/1982
JP    01262672 A  * 10/1989

* cited by examiner

Primary Examiner—Nathan J. Flynn
Assistant Examiner—Remmon R. Fordé
(74) Attorney, Agent, or Firm—Fish & Richardson P.C.

(57) ABSTRACT

A semiconductor imaging device is disclosed. The device includes a substrate having at least first and second surfaces opposing each other, and a circuit layer. The substrate is doped to exhibit a first conductivity type. The substrate includes a conducting layer, a region, and a plurality of doped regions. The conducting layer includes a first type dopants incorporated near the first surface. The region includes a heavily doped area within the substrate near the second surface. The plurality of doped regions includes a second type dopants formed on the second surface. The circuit layer is formed over the second surface to provide gate contacts to and readout circuits for the plurality of doped regions. The readout circuit provides readout of optical signals from pixels.

16 Claims, 2 Drawing Sheets

INDIRECT BACK SURFACE CONTACT TO SEMICONDUCTOR DEVICES

CROSS-REFERENCE TO RELATED APPLICATION

This application is a continuation of application Ser. No. 09/607,547, filed Jun. 29, 2000, which claims benefit of the priority of U.S. Provisional Application Serial No. 60/142,139, filed Jul. 2, 1999 and entitled "Indirect Back Surface Contact to Semiconductor Devices."

BACKGROUND

The present invention relates to semiconductor imaging devices, and more specifically to indirect back surface contact in such imaging devices.

Many semiconductor device structures, such as photodiode arrays, include circuit elements fabricated within a few micrometers of one surface of a die cut from a wafer. This surface is often the front surface. The metal or polysilicon lines connecting individual circuit elements are located on the front side of the die. Therefore, electrical connection to the back surface of the semiconductor is made through one or more conductive back contact layers external to the semiconductor and covering all or part of the back surface of the die. Materials commonly used for external contact layers, individually or in combination, are metals, heavily doped polycrystalline semiconductors, conductive dielectrics such as indium-tin oxide (ITO), and conductive adhesives.

When the back contact to the die is made through the back surface, the process of making an electrical contact also requires making a physical contact to the back of the die. The need to make the physical contact increases the complexity of the assembly process necessary to integrate the die into higher-level systems such as multi-chip modules (MCM). For example, in a "flip-chip" mounting, conductive "bump" contacts are made to bonding pads on the front surface of the die. The die is then flipped so that the bump contacts can be bonded or soldered to corresponding contacts on the top surface of a printed circuit board or semiconductor MCM. The back surface contact cannot be accomplished directly in the flip-chip process. Therefore, a second, distinct process may be performed to connect the back surface to the MCM. In some cases, where the geometry is very restrictive, there may not be any space to make the necessary wire- or tape-bond from the back of the wafer to the MCM.

In the case of back-illuminated photodiodes or radiation detectors, the presence of the physical contact has several other disadvantages. The back contact may make part of the back opaque and therefore may decrease the effective area of the detector. It may also interfere with the attachment of optical input structures, such as optical fibers or scintillators, which need to be mounted close to the back surface for good optical coupling. The physical contact may reduce the maximum area of the optical input device.

The physical contact may also limit the options for assembling mosaic detectors, in which several small detectors could be illuminated through a single fiber or scintillator. Even if no optical input structure is used, assembling a large mosaic structure such as an integrating sphere of back-illuminated detectors may be complicated by the need to make physical contact to the back of each individual detector.

Further, back-illuminated detectors often employ a thin, conductive bias electrode layer within the semiconductor. The detectors may also employ one or more thin, transparent external back contact layers. The transparent bias electrode layer may transmit a high percentage of incident light in the wavelength range of interest. The layer should be thin enough and have a long enough diffusion length so that minority photocarriers generated within the layer have a high probability of being collected. However, both the bias electrode layer and the thin external contact structure may be easily damaged. Great care must be exercised in forming the physical contact. In addition, electrical current passing through the interface between the external contact and the internal bias electrode layer can be a significant source of electrical noise.

A plurality of p-i-n photodiode array structures is typically fabricated on a single semiconductor wafer. The individual arrays. are then separated by "dicing" the wafer into "chips". The dicing process inherently produces additional surfaces on the "edges" of the chips. These surfaces can generate minority carriers that can drift or diffuse into the active regions of the device, significantly increasing the leakage currents of the photodiodes.

SUMMARY

The present disclosure includes a semiconductor photodiode array. The array includes a substrate having at least first and second surfaces opposing each other, and one or more circuit layers.

The substrate is doped to exhibit a first conductivity type. The substrate includes a thin, conductive internal bias electrode layer, an indirect back contact region, and a plurality of doped regions. The bias electrode layer includes one or more first type dopants incorporated near the first surface. The indirect back contact region includes a heavily doped area formed near the second surface. This region is configured to provide contact to the first surface from the second surface. The plurality of doped regions includes one or more second type dopants near the second surface.

One or more circuit layers are formed over the second surface to provide electrical contacts to and readout circuits for the plurality of doped regions. The readout circuits may generate electrical output signals that depend on the response of the individual photodiodes to incoming photons.

DETAILED DESCRIPTION

Figure 1:
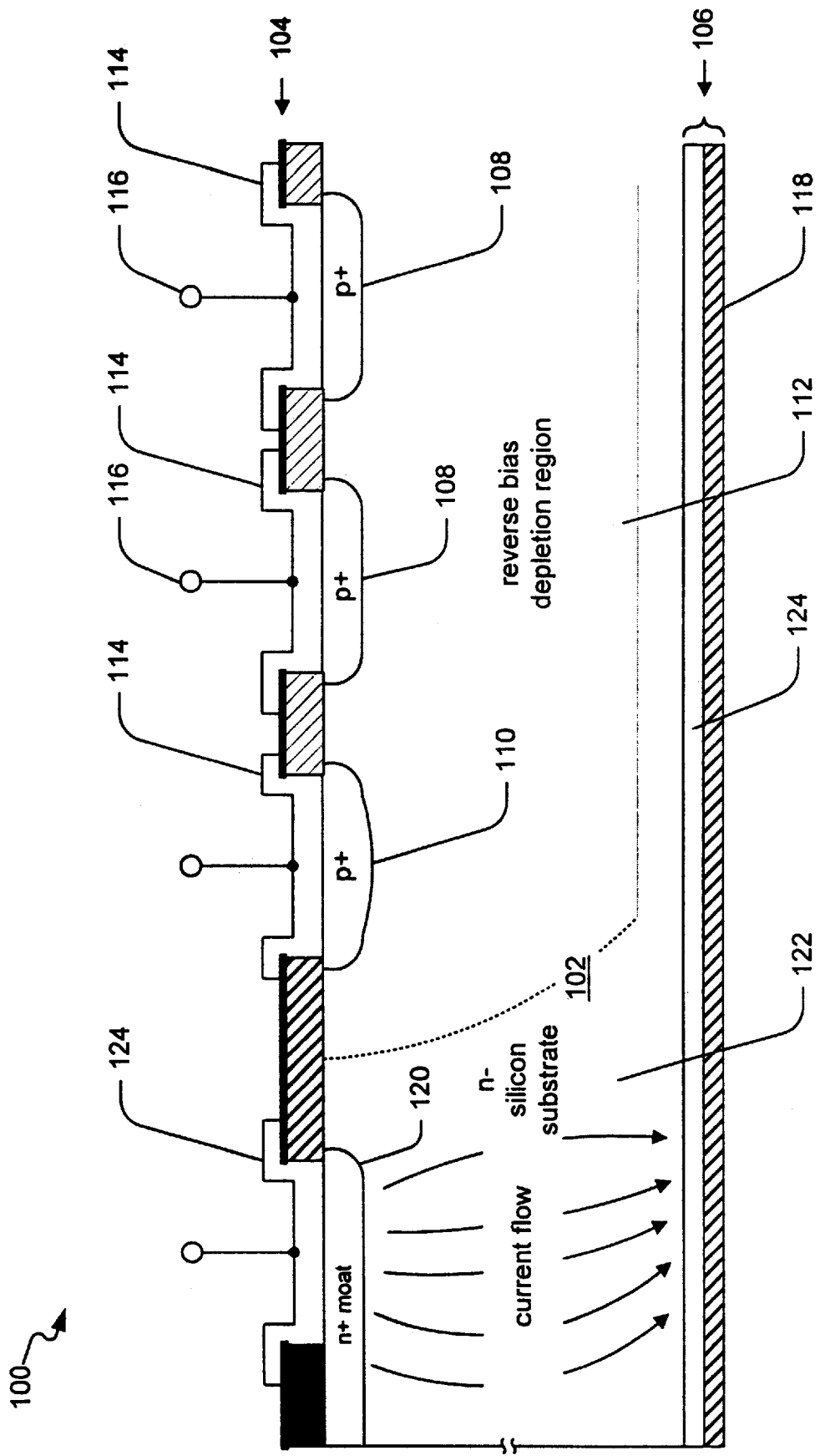
FIG. 1 shows a back-illuminated photodiode array according to an embodiment of the present invention.

In recognition of the above-described difficulties, it was determined that a simple, physically robust way to make electrical contact to the back of a semiconductor die from the front of the die would be advantageous. The advantages of this indirect back surface contact would be especially important in flip-chip applications. The technique may minimize noise generation of the back contact. The technique may also maximize the physically and optically accessible area on the back of the die.

In one embodiment, a semiconductor photodiode array may include a substrate having a front side upon which is formed an array of gates and readout circuits, and an opposing back side formed with a bias electrode layer. Each gate on the front side is electrically and physically connected to a doped region with a conductivity type different from the conductivity type of the remaining substrate between the gate and the bias electrode layer. The bias electrode layer may include a heavily doped layer with the same conductivity type as the substrate. For example, the doped region may have p-type conductivity, the substrate may be n-doped to have n-type conductivity, and the bias electrode layer may accordingly be effected by a heavily n-doped conducting layer.

A potential difference, referred to as a bias, can be applied between the gate and the bias electrode layer to produce a depletion region extending into the substrate from the junction between the doped region on the front side and the substrate. Hence, a photodiode is effected by the doped region connected to one gate, the substrate, and the bias electrode layer. In the example used herein, the p+ doped region is the anode of the photodiode, and the bias electrode layer is the cathode. The external structure is the anode contact. For brevity, the terms anode and cathode will be used below in the context of this example.

For a back-illuminated photodiode, photocurrent is often generated by band-to-band absorption. Photons with energy greater than the bandgap of the semiconductor enter the back of the substrate and are absorbed. The absorption produces electron-hole pairs. If an electron-hole pair is generated outside the depletion region, the minority carrier (a hole in the example used herein) diffuses to the edge of the depletion region beneath one of the gates. The electric field within the depletion region "collects" the hole by accelerating it towards the anode. If, however, a photon is absorbed within the depletion region below the anode, the electric field "collects" the hole, but accelerates the electron towards the undepleted substrate. In either case, a photocurrent may flow through the photodiode and the external circuitry that maintains the bias between the gate (anode contact) and the back contact (cathode contact). If readout circuitry is provided on same semiconductor substrate, the circuit elements associated with each anode will produce an output signal that depends on the photocurrent, the quantity of charge caused by the photon absorption, or a combination of both.

In a back-illuminated photodiode array, the use of a typical broad-area metal or conductive epoxy contact may be difficult. These layers would make the back of the die opaque. Back-illuminated photodiodes and photodiode arrays require that light, or other radiation such as x-ray or infrared, be able to enter the back surface of the die with little reflection or attenuation. Further, an appropriate technique must be provided to make electrical contact to the back of the die in order to allow the device to be biased properly. Therefore, a transparent "conductive dielectric" anti-reflection (AR) coating such as indium tin oxide (ITO) is formed over a heavily doped layer which constitutes the internal anode or over an external back contact layer. The term "conductive dielectric" is often used to refer to the ITO, which is actually a degenerate wide-bandgap semiconductor (usually amorphous or vitreous). The ITO decreases the sheet resistivity of the backside of the die. However, the ITO is soft, easily scratched and not amenable to wire-bonding.

In Holland, U.S. Pat. No. 6,025,585, a p-i-n photodiode array using a thin, highly doped polycrystalline silicon layer is deposited on the back of the crystalline semiconductor substrate as an external transparent, conductive back contact layer. The polycrystalline silicon layer is approximately 10 nm thick. This polysilicon layer is then coated with the ITO as a conductive AR coating. However, the polysilicon layer of Holland is not a cathode or "bias electrode layer" in the sense used herein. It has a heterogeneous interface with the crystalline substrate and may therefore exhibit excess electrical noise as discussed below.

An electrical contact to the ITO may be made by using "silver epoxy," which is an epoxy adhesive "filled" with silver (Ag) by admixture of silver flakes. Unfortunately, in the context of flip-chip bonding of the several dice to an MCM, epoxy bonding to the backside is time-consuming and not amenable to automation. "Silver bus" structures of conductive paint or metal tape equipped with a conductive adhesive have been used. These structures reduce the effective photosensitive area of the detector and interfere with attachment of optical input structures.

Another characteristic common to all of these thin, transparent external contact structures is that the layers involved have relatively high sheet resistivities and are prone to forming non-uniform electrical contact to the underlying substrate. Furthermore, use of overlayers such as ITO or polysilicon introduce additional interfaces into the contact structure. Passing electrical current through these non-uniform structures and interfaces may result in the generation of electrical noise with significantly higher levels than would be expected from simple resistors of the same average resistance value.

The present disclosure permits the elimination of conducting transparent overlayers such as ITO. The elimination of the overlayers is accomplished by providing an indirect contact to the bias electrode layer (cathode in the example). This allows the anti-reflection (AR) layer to be preferably composed of an insulating dielectric material or a multilayer dielectric stack in order to optimize the transmission of light, or other radiation such as x-ray or infrared, into the photodiode. Design of single and multi-layer dielectric AR coatings is known. For example, under normal incidence, the refractive index of a single dielectric layer AR coating should be close to the geometric mean of the refractive indices of the substrate and the medium at the backside of the dielectric. The thickness of the layer should be one-fourth the wavelength of the light or other radiation, measured within the layer. Thicknesses of three-fourths, five-fourths, and so on, of the wavelength in the dielectric may also be used. Hence, the AR layer or layers may be configured independently from electrical considerations and may be selected from a wide range of dielectric (insulating) materials to achieve the appropriate optical performance. The use of dielectric AR coatings allows for a high photon-collection efficiency that is often difficult to achieve by using the limited selection of conducting anti-reflection materials.

Contact to the back of semiconductor dice has been made from the front surface by using deep "vias" etched through the die and by "wrap-around contacts" plated over the edge of the die. Both of these techniques are difficult to perform with high yield. Deep vias may also weaken the die and encourage breakage. Contacts to the back have also been made by using heavily doped substrates, not capable of full depletion below the breakdown voltage of the substrate. The device structures are then fabricated near the front surface and isolated from the substrate by formation of "wells" of a second conductivity type (opposite to that of the substrate) on the front surface. The wells must be deeper than the depth of the active layers of the devices. Well isolation involves complicated processes, creates parasitic structures not inherent in the basic device design, and is incompatible with fully depleted substrates. It is therefore unsuitable for fabrication of highly responsive back-illuminated p-i-n photodiode arrays.

The present disclosure provides for making the desired low-noise electrical connection through a physically robust structure on the front surface of the substrate. Further, the present disclosure allows connection to the "back contact" to be made simultaneously with the front surface contacts in a flip-chip or similar assembly process.

A back-illuminated photodiode array 100 according to an embodiment is shown in FIG. 1. In the illustrated embodiment, a semiconductor substrate 102 is lightly doped to exhibit n-type conductivity (n−) and have a high resistivity. In the case of a p-i-n photodiode array, the lightly doped n-type semiconductor is often denoted as intrinsic or i-type. Near the top surface of the lightly doped n-type semiconductor substrate 102, heavily doped p-type (p+) anode regions 108 may be formed. Metallic or polysilicon contacts 114 may be formed directly on the p+ regions 108 to provide ohmic contacts.

The semiconductor substrate 102 may also include junctions formed between the p+ regions 108 and the lightly doped n-type substrate 102. These junctions create depletion regions 112 that are essentially devoid of majority carriers (electrons in the case of the n-type substrate 102). Under bias of the appropriate polarity (reverse bias) and magnitude, the depletion regions 112 may extend deeply into, or completely through, the thickness of the substrate 102.

For efficient detection, the electron-hole pair should be generated either inside or within a diffusion length or so of the depletion region 112. To achieve maximum response, the depletion region 112 under each heavily doped anode region 108 should extend completely through the region of the substrate 102 beneath the anode (full depletion).

In the illustrated embodiment, a contact is made to the backside 106 of the substrate 102 through the front side 104. The backside contact through the front is made possible by providing a "moat" of the same conductivity type as the semiconductor substrate and the bias electrode layer 124.

The moat 120 is heavily n-doped (n+), and is provided on the front side 104 of the substrate 102. The n+ moat 120 makes contact to the individual photodiodes (pixels) in a low leakage, fully depleted photodiode array 100 from outside a fully depleted guard ring 110. The fully depleted guard ring 110 isolates the n+ moat 120 from all the pixels in the array. In a fully depleted photodiode array, the depletion regions beneath the individual pixels and the guard ring 110 extend back to the cathode 124 and may merge horizontally, as shown, over most of the thickness of the substrate 102 beneath the pixels and the guard ring. Under these conditions, a generated minority photocarrier entering the merged depletion region underneath the pixels may be substantially certain of being collected by one of the pixels.

An external transparent layer 118 may be provided on the backside 106 of the substrate 102 to make contact to the internal cathode. The external transparent layer 118 may be formed with a conductive material such as ITO. However, with the present disclosure, the transparent layer 118 may also be formed with one or more dielectric (insulating) materials such as titanium dioxide ($TiO_2$), aluminum oxide ($Al_2O_3$), zirconium dioxide ($ZrO_2$), zinc sulfide (ZnS) or, silicon dioxide ($SiO_2$). The use of dielectric materials in forming the external transparent layer 118 may provide a strong, chemically stable and scratch-resistant surface that enhances the quantum efficiency of the photodiodes in the wavelength range of interest. Without an indirect back contact, such as provided by the n+ moat, making contact to the back of a photodiode array with an insulating AR coating is difficult.

The n+ moat contact 120 uses an undepleted region 122 of the substrate 102 in series with the internal bias electrode layer (cathode) 124 and, in some embodiments, one or more external transparent conductive layers 118 to provide an electrical contact to the cathode. Fabrication of low leakage current p-i-n photodiode arrays may employ thorough gettering of the substrate to achieve long minority carrier lifetimes and diffusion lengths. The internal bias electrode layer 124 may be formed by a back-etching process subsequent to the gettering step. The back etching process may be compatible with maintaining the superior minority carrier properties and low leakage resulting from the gettering process.

The n+ moat structure may also be important in suppressing high guard ring leakage currents associated with minority carrier injection at the edges of the die. Minority carriers generated at the edges may diffuse into the depletion region of the guard ring. Under fully depleted or nearly fully depleted conditions, the electric field in the guard ring depletion region efficiently collects these minority carriers, preventing them from being collected by the pixels. Accordingly, edge generation can lead to high guard ring leakage currents.

The heavily doped n+ moat is a region of very low minority carrier concentration. Therefore, minority carriers generated at the edges of the die will tend to diffuse toward the n+ moat, where they can recombine with the abundant supply of electrons there.

The n+ moat 120 may be as large in area as possible. The moat 120 may also occupy as much of the periphery of the die as possible. In the illustrated embodiment, the substrate 102 and bias electrode layer are n-type, so an n+ moat 120 may be used. The moat geometries used may be roughly annular, with the inside edge of the n+ layer extending to within 30–60 micrometers of the nearest p+ layer. The moat 120 extends outward to the edge of the substrate.

Contact 124 to the moat 120 may be made in conventional manner. Thus, aluminum may be used as the contact metal and may be sintered at around 325–400° C. to form an ohmic contact. To minimize series resistance, the aluminum layer may form a ring substantially surrounding the active device region.

The experimental embodiments of the present disclosure are described herein. For example, indirect back surface contacts as described above have been embodied in silicon p-i-n photodiode arrays with sixteen individual photodiode pixels in a 4×4 array. These arrays were fabricated in high resistivity (>1000 ohm-cm) n-type silicon substrates using conventional silicon process technology. The overall chip size of these arrays was approximately 12.8×13.0 mm.

Heavily doped p+ layers were used for the internal anodes of individual pixels and the guard ring. The guard ring was annular and substantially surrounded the entire periphery of the array of sixteen pixels. The anodes of the pixels were approximately 2.9×2.9 mm in area. The cathode bias electrode layer was formed by etching an n+ diffusion on the back surface. Etching was terminated at a backside sheet resistivity compatible with high quantum efficiency and acceptable series resistance. Thorough gettering of the substrate was performed prior to the etching process. Both before and after etching, reverse bias leakage currents were below $1 nA\text{-}cm^{-2}$ at room temperature with full depletion.

A thermally grown silicon dioxide field oxide, nominally 0.5 to 1.0 micrometer thick, passivated the gaps between the pixels and over other regions of the chips. Metal contacts were formed by sputter deposition of approximately 1 micrometer of aluminum containing nominally 1% of dissolved silicon (Al:Si). The contacts were formed over substantially the entire active p-type region and overlapping the edges of the field oxide. A double-layer metal system has been used, each layer nominally 1.0 micrometer thick. The metal system included Al:0.5%Cu (Al:Cu) over Al:Si. The second metal layer is often connected to the first layer through holes etched in a second-level passivation insulator, deposited over the field oxide. Both silicon dioxide and silicon nitride have been used for this second-level passivation.

Both the single and double-layer metal systems have been used in conjunction with an under bump metallization (UBM) system. The UBM is used to facilitate fabrication of solder balls on the chips. It is fabricated on top of the metal contacts by addition of 5 to 7 micrometers of nickel deposited by electroless plating, followed by approximately 0.1 micrometers of immersion gold.

Indirect back surface contacts to these arrays were fabricated using a heavily doped n+ moat surrounding the outer periphery of the guard ring. The n+ layer extended outward to the edge of each die. The moat was a closed ring with width varying from approximately 250 to 500 micrometers.

The presence of the n+ moat has been found to reduce the guard ring current of photodiode arrays before dicing by 30 percent or more, and by even larger ratios after dicing.

Figure 2:
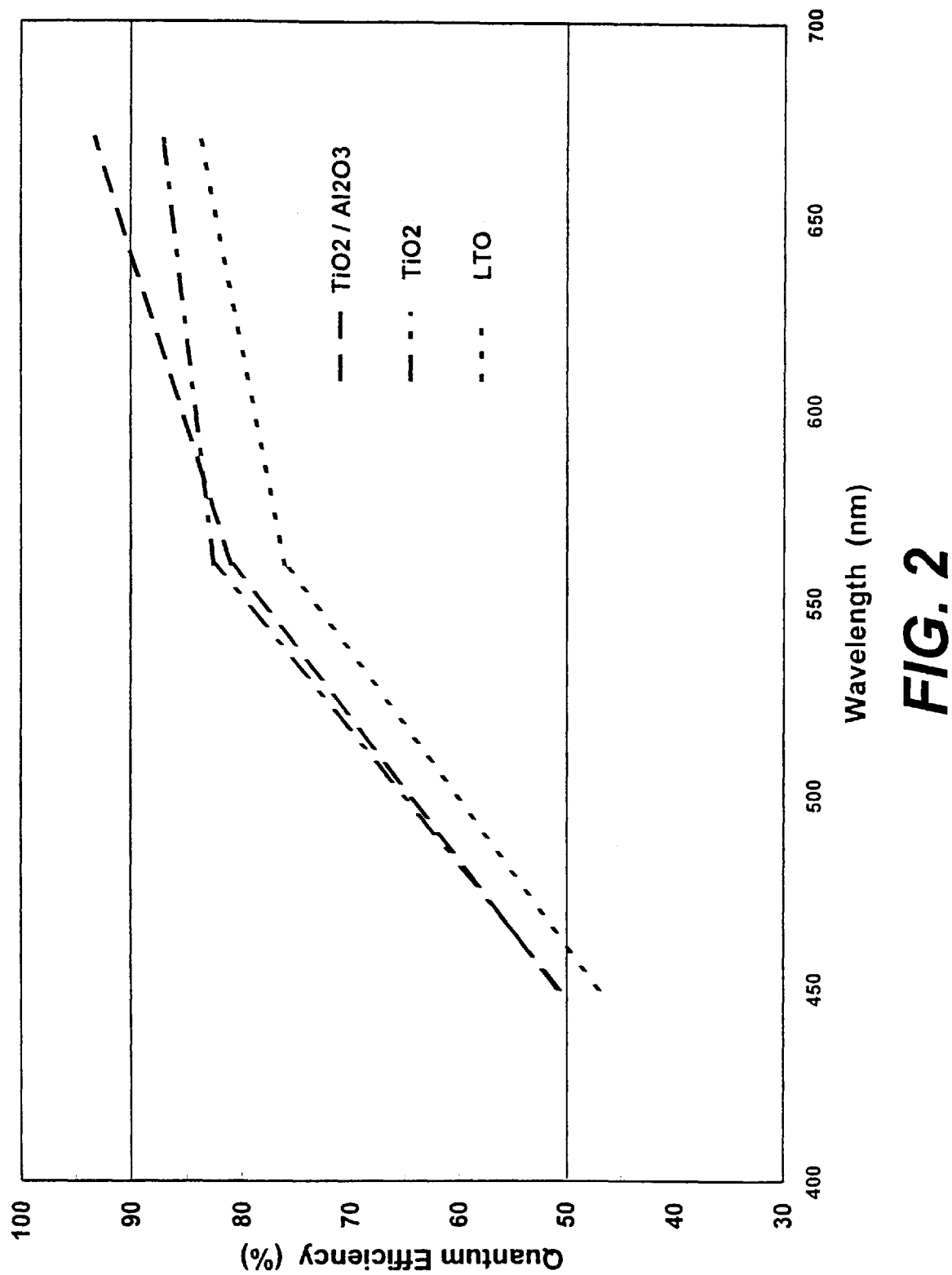
FIG. 2 illustrates the superior optical performance of arrays coated with $TiO_2$ and with $TiO_2$ overcoated with $Al_2O_3$ in comparison with ITO.

Arrays have been fabricated with external back (cathode) contact layers of conductive ITO, and with insulators including $SiO_2$, ZnS, $ZrO_2$, $TiO_2$, $Al_2O_3$, and $TiO_2$ overcoated with $Al_2O_3$. Arrays with good quantum efficiency using all of these materials have been produced. Statistically, insulators with high refractive indices (ZnS, $ZrO_2$, $TiO_2$, $Al_2O_3$, and $TiO_2$ overcoated with $Al_2O_3$) perform better optically than ITO. All the insulators are mechanically superior to ITO. Arrays AR coated with $TiO_2$ and with $TiO_2$ overcoated with $Al_2O_3$ have shown the best overall performance. FIG. 2 illustrates the superior optical performance of arrays coated with $TiO_2$ and with $TiO_2$ overcoated with $Al_2O_3$ in comparison with ITO.

In summary, many photodiode arrays, AR coated with one or more insulating layers, have been produced. These photodiode arrays have been embodied into prototype and production versions of the DIGIRAD 2020TC™. This product may be the world's first commercial solid-state gamma-ray imager.

While specific embodiments of the invention have been illustrated and described, other embodiments and variations are possible. For example, although the invention has been described in terms of an n+ moat formed on a lightly doped n-type substrate, the invention may be practiced with p+ moat formed on a lightly doped p-type substrate. In the case of a p+ moat, the bias electrode layer is the anode and the heavily doped n+ layers of the pixels and guard ring are cathodes.

All these are intended to be encompassed by the following claims.

What is claimed is:

1. A semiconductor imaging device, comprising:
    a substrate having at least first and second surfaces opposing each other, and doped to exhibit a first conductivity type, said substrate including:
       a bias electrode layer of the first conductivity type formed internal to the substrate, near the first surface,
       a region of the first conductivity type heavily doped over the second surface, said region configured to provide contact to the first surface from the second surface, and
       a plurality of doped regions of a second conductivity type on the second surface; and
    a circuit layer formed over the second surface to provide gate contacts to and readout circuits for said plurality of doped regions, such that the readout circuits provide electrical outputs related to the optical signals detected by pixels.

2. The device of claim 1, further comprising:
    a guard ring formed between said region of the first conductivity type and said plurality of doped regions of the second conductivity type, said guard ring configured to isolate said region of the first conductivity type from the pixels.

3. The device of claim 2, wherein said region of the first conductivity type reduces leakage current of said guard ring.

4. The device of claim 1, wherein said first and second conductivity type is caused by n-type dopants and p-type dopants, respectively.

5. The device of claim 1, wherein said substrate includes silicon.

6. The device of claim 1, wherein said bias electrode layer is coated with one or more transparent layers to provide an external transparent contact layer, anti-reflective coating, or both an external transparent contact layer and a anti-reflective coating.

7. The device of claim 6, wherein said transparent layers include one or more insulating dielectric layers.

8. The device of claim 7, wherein said dielectric layers include one or more of titanium dioxide ($TiO_2$), aluminum oxide ($Al_2O_3$), zirconium dioxide ($ZrO_2$) zinc sulfide (ZnS), or silicon dioxide ($SiO_2$).

9. The device of claim 1, wherein said substrate further includes junction regions between the plurality of doped regions of the second conductivity type and the bias electrode layer of the first conductivity type.

10. The device of claim 9, wherein said junction regions are fully depleted to allow photon sensing from the first surface.

11. The device of claim 1, wherein said region of the first conductivity type is a heavily doped n-type moat.

12. A photodiode array, comprising:
    a substrate with at least two surfaces opposing each other, said substrate formed with a first type dopants;
    a conducting layer of a first conductivity type within the substrate near one of said at least two surfaces of said substrate;
    a moat heavily doped with the first type dopants, and formed on an opposite surface from said conducting layer,
    where said moat is configured to provide contact to the conducting layer from the opposite surface; and
    a plurality of regions doped with a second type dopants on same surface as said moat.

13. The array of claim 12, wherein said semiconductor substrate includes silicon.

14. The array of claim 11, further comprising:
    a plurality of metal contacts coupled to said plurality of regions to provide ohmic contacts.

15. The array of claim 11, wherein said substrate further includes junction regions between the plurality of regions and the conducting layer.

16. The array of claim 15, wherein said junction regions are fully depleted to allow photon sensing from a surface opposite said conducting layer.

* * * * *